(12) United States Patent
Kamada et al.

(10) Patent No.: US 7,544,899 B2
(45) Date of Patent: Jun. 9, 2009

(54) PRINTED CIRCUIT BOARD

(75) Inventors: Hiroyuki Kamada, Takanezawa-machi (JP); Akira Sato, Kakuda (JP)

(73) Assignee: Keihin Corporation, Tokyo (JP)

( * ) Notice: Subject to any disclaimer, the term of this patent is extended or adjusted under 35 U.S.C. 154(b) by 102 days.

(21) Appl. No.: 11/295,542

(22) Filed: Dec. 7, 2005

(65) Prior Publication Data

US 2006/0125081 A1    Jun. 15, 2006

(30) Foreign Application Priority Data

Dec. 10, 2004   (JP) ............................. 2004-357758

(51) Int. Cl.
  *H05K 1/16* (2006.01)
(52) U.S. Cl. ...................... 174/260; 174/262
(58) Field of Classification Search ................ 174/260, 174/261, 262; 361/792, 793, 794, 795, 760
  See application file for complete search history.

(56) References Cited

U.S. PATENT DOCUMENTS

| | | | | |
|---|---|---|---|---|
| 3,693,052 A | * | 9/1972 | Galanti | 361/773 |
| 3,747,045 A | * | 7/1973 | Stross | 439/55 |
| 5,371,653 A | | 12/1994 | Kametani et al. | |
| 5,726,862 A | * | 3/1998 | Huynh et al. | 361/773 |
| 6,071,756 A | * | 6/2000 | Sines et al. | 438/107 |

FOREIGN PATENT DOCUMENTS

| | | |
|---|---|---|
| EP | 0 621 747 A3 | 10/1994 |
| JP | 04-144299 A | 5/1992 |
| JP | 09-008443 | 1/1997 |
| JP | 2002-217533 | 8/2002 |
| JP | WO2005074338 A1 * | 8/2005 |
| WO | WO 2005/112531 A1 | 11/2005 |

OTHER PUBLICATIONS

Computer translation of Japanese Application Publication No. 09-008443.*
United Kingdom Search Report dated Apr. 11, 2006.
Office Action dated Dec. 18, 2007 issued in corresponding Japanese Application No. 2004-357758.

* cited by examiner

*Primary Examiner*—Ishwar (I. B.) Patel
(74) *Attorney, Agent, or Firm*—Westerman, Hattori, Daniels & Adrian, LLP.

(57) ABSTRACT

In a printed circuit board on which a first conductor pattern, a second conductor pattern of smaller area than the first conductor pattern and electronic components are mounted, a gap between a first through-hole connected to the first conductor pattern and a first lead pin inserted therein is defined to be larger than that between a second through-hole connected to the second conductor pattern and a second lead pin. With this, it becomes possible to improve solder rise property, without increasing the number of electronic component production processes or degrading strength with respect to the electronic component.

6 Claims, 3 Drawing Sheets

[FIG. 1]
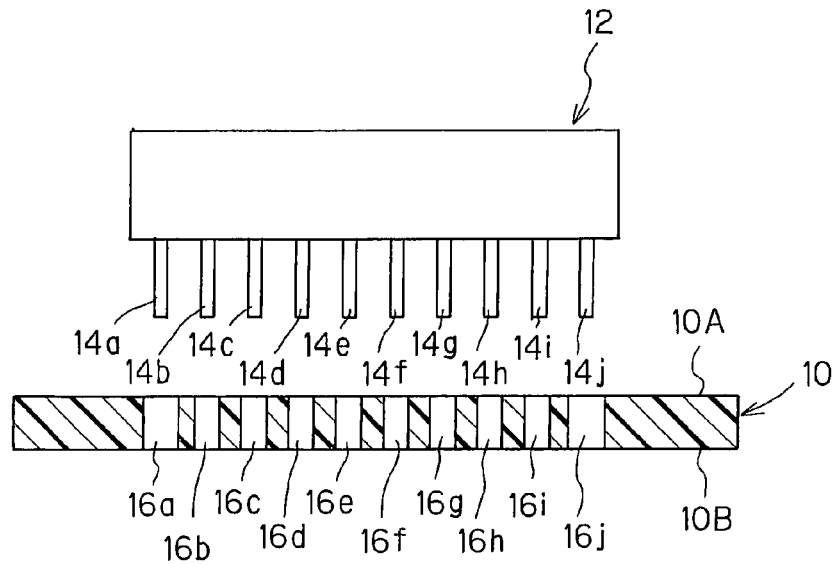
[FIG. 2]
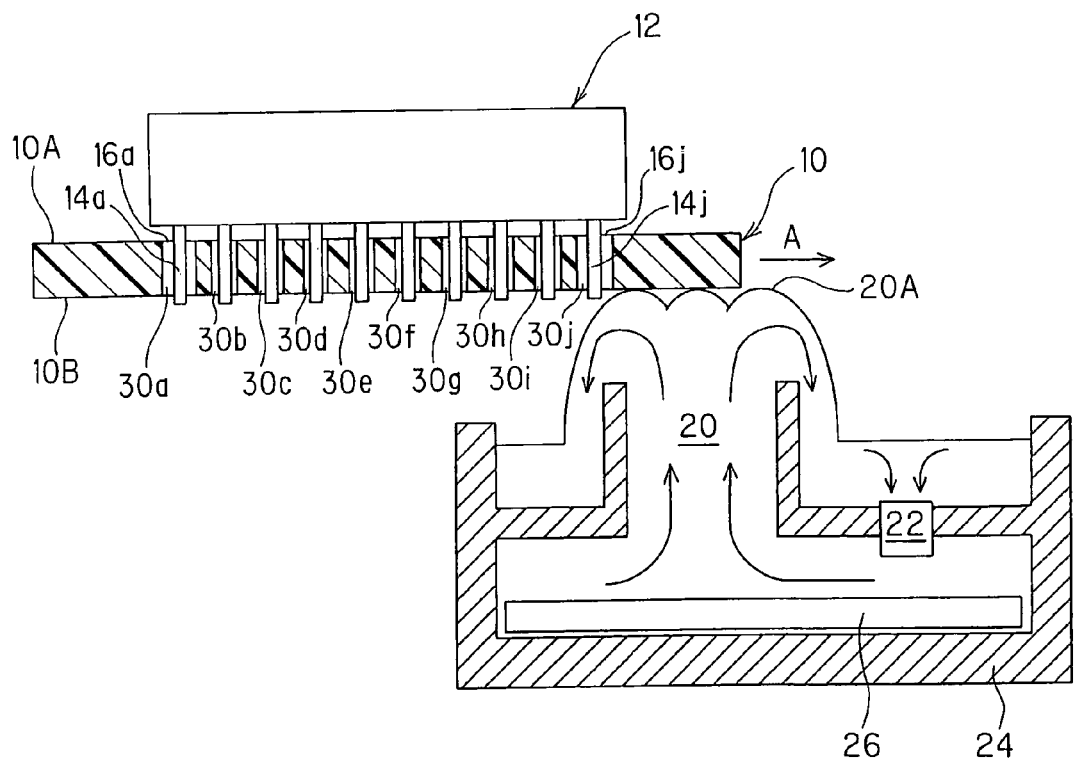

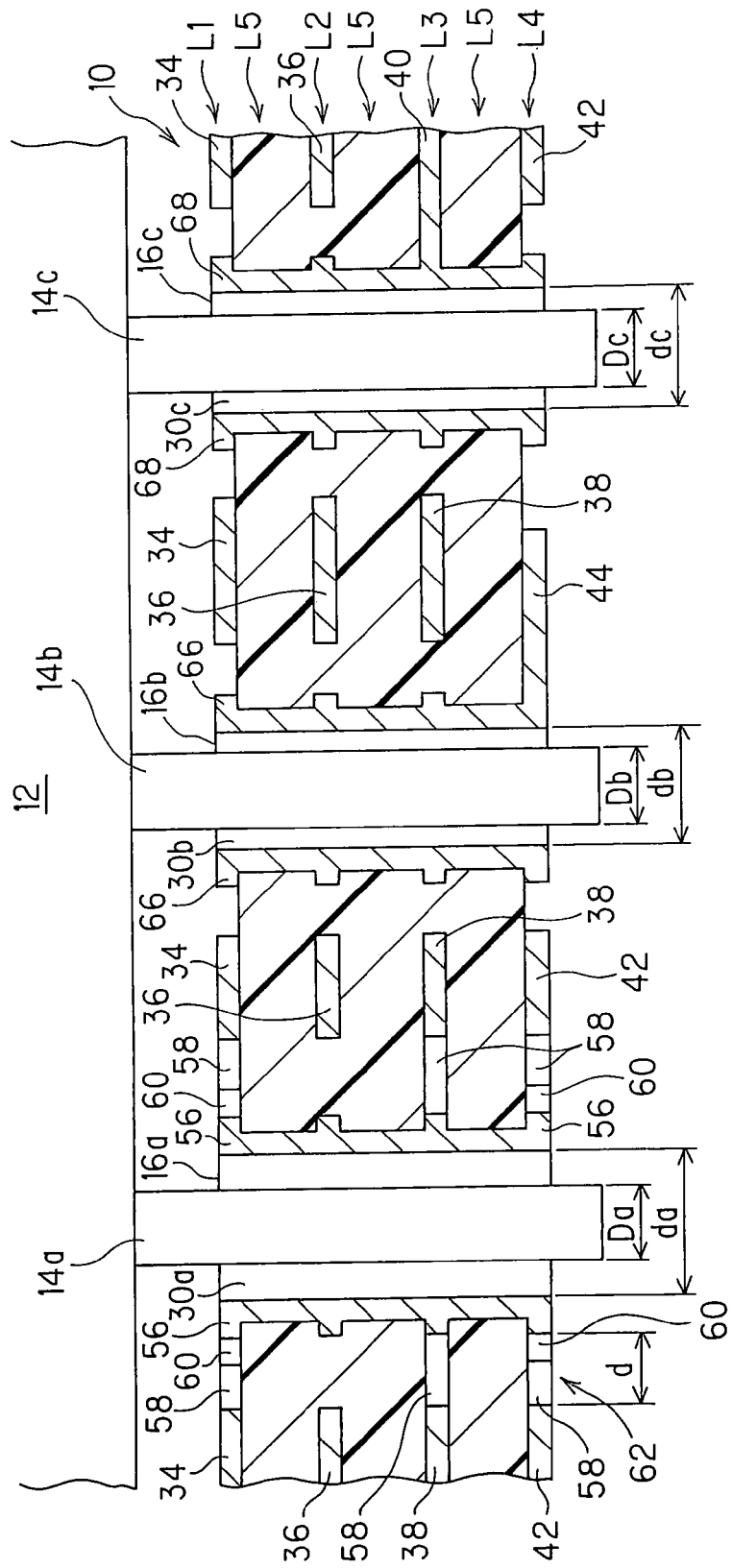
[FIG. 3]

[FIG. 4]
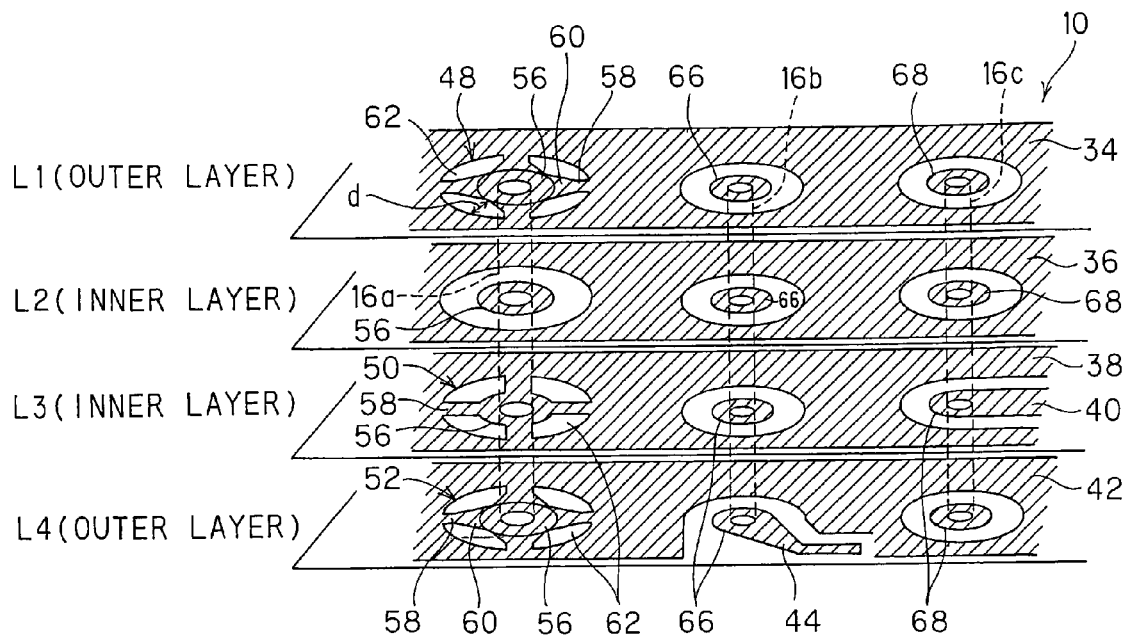
[FIG. 5]
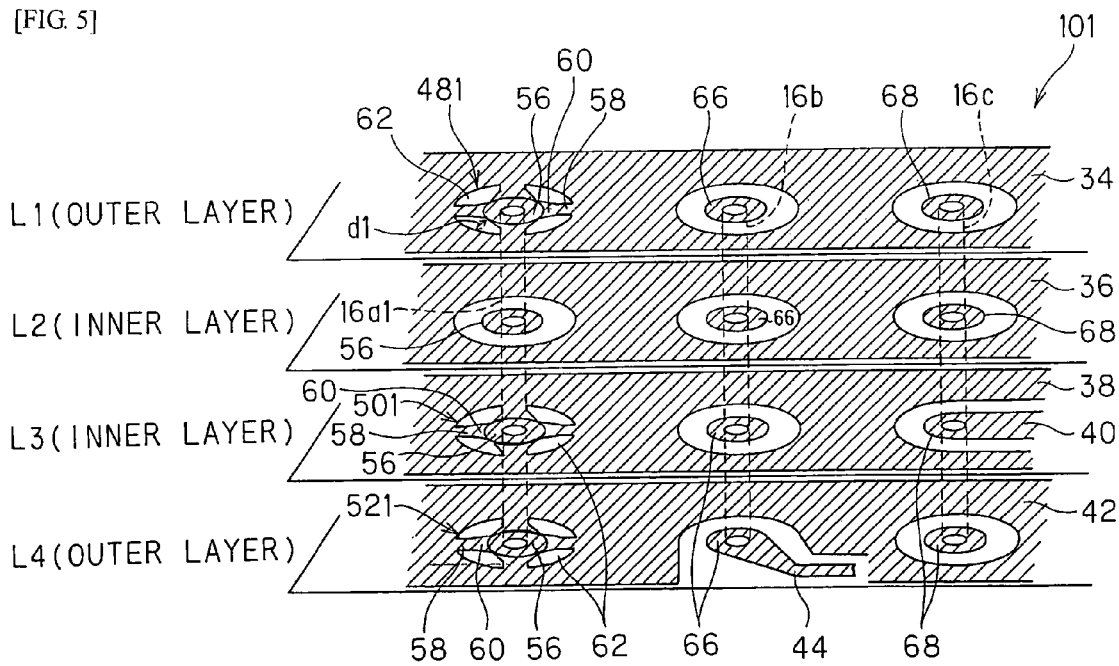

PRINTED CIRCUIT BOARD

BACKGROUND OF THE INVENTION

1. Field of the Invention

This invention relates to a printed circuit board, more particularly to the structure of a printed circuit board having through-holes and thermal lands.

2. Description of the Related Art

Electronic components formed with lead pins (such as transistor modules) are commonly solder-mounted on a printed circuit board by the insert-mount method. Specifically, what is called "flow-soldering" is commonly adopted in which the lead pins of the electronic components are first inserted into through-holes formed in the printed circuit board and soldering is then conducted by bringing the printed circuit board into contact with molten solder. Owing to environmental concerns, use of lead-free (Pb-free) solder has become the norm in recent years.

In flow-soldering, the soldering is achieved by causing the molten lead-free solder to rise into (fill) the gaps between the through-holes and the lead pins. In the course of the soldering, the heat of the molten lead-free solder escapes via the conductor patterns connected to the through-holes. This escape of the solder heat has the undesirable effect of causing the solder to fall below its solidification temperature and solidify before it fills the gaps between the through-holes and lead pins, i.e., before the solder rises to the prescribed level.

It is known that the escape of heat can be inhibited by forming thermal lands between the through-holes and the conductor patterns as taught by, for example, Japanese Laid-Open Patent Application No. Hei 9(1997)-8443 ('443), particularly paragraphs 0005 and 0030-0032, and FIGS. 4-6 and 9.

However, the heat capacity of a conductor pattern increases in proportion as its surface area increases. As a result, the amount of solder heat escaping through a conductor pattern connected to a thermal land increases when the conductor pattern is of relatively large area (e.g., when it is a "broad pattern" such as one used for power supply or grounding). The inconvenience of the solder solidifying before rising to the prescribed level therefore persists in such cases. This leads to the conclusion that mere formation of thermal lands between the through-holes and conductor patterns is not sufficient in the point of improving the solder rise property. In order to prevent solder heat from escaping to the conductor patterns it is possible, as shown in FIGS. 4 to 6 of the above reference '443, to reduce the number of linear regions of the thermal lands or to make their width narrower. However, this solution is difficult to implement owing to the current-carrying capacity required between the through-holes and conductor patterns.

In response to this difficulty there has emerged the teaching of Japanese Laid-Open Patent Application No. 2002-217533 ('533; particularly paragraphs 0016 and 0017, and FIG. 1), which is to bring bent lead pins into contact with the land regions of the through-holes so as to transfer the heat of the lead pins to the land regions, thereby heating the land regions and preventing the temperature of the molten solder from falling sharply.

However, the diameter of the printed circuit board through-holes is ordinarily made only slightly larger than the diameter of the lead pins. Therefore, when there are multiple through-holes and lead pins and the lead pins are all of substantially the same diameter, all of the through-holes are also formed to the same diameter. As a result, the gaps between the through-holes and the lead pins also all come to have about the same size. Specifically, the size of the gaps is typically made uniform at about 0.3 mm.

Therefore, when a configuration like that of the reference '533 is adopted that brings bent lead pins into contact with the land regions of the through-holes, the tiny openings at the through-holes (near the exit of the gaps between the through-holes and the lead pins) are partially blocked to decrease the areas thereof. This makes it hard for gases generated during soldering, specifically the air in the through-holes, vapor generated owing to evaporation of moisture contained in the printed circuit board, and the like, to discharge from the openings. A problem of the molten solder not rising to the prescribed level is therefore liable to occur.

In addition, the need to bend the lead pins inconveniently increases the number of lead forming processes (i.e., production processes).

Further, since no fillets are formed at the points where the land regions make contact with the bent lead pins, the amount of solder constituting the fillets decreases. As a result, the strength with respect to a relatively large mounted electronic component may be insufficient, in which case defective connections are liable to occur.

SUMMARY OF THE INVENTION

An object of this invention is therefore to overcome the foregoing problems by providing a printed circuit board that during mounting of an electronic component thereon enables molten solder to rise to the prescribed level in the gaps between the through-holes and lead pins, i.e., that can achieve improved solder rise property, without increasing the number of electronic component production processes or degrading strength with respect to the electronic component.

In order to achieve the object, the present invention provides a printed circuit board having at least a first conductor pattern, a second conductor pattern whose area is smaller than that of the first conductor pattern, and electronic components having at least a first lead pin and a second lead pin, comprising: a first through-hole formed to be connected to the first conductor pattern for insertion of the first lead pin; and a second through-hole formed to be connected to the second conductor pattern for insertion of the second lead pin, wherein a gap between the first through-hole and the first lead pin is made larger than that between the second through-hole and the second lead pin.

BRIEF DESCRIPTION OF THE DRAWINGS

The above and other objects and advantages of the invention will be more apparent from the following description and drawings in which:

FIG. 1 is a partial cross-sectional explanatory view showing a printed circuit board according to a preferred embodiment of this invention together with an electronic component;

FIG. 2 is a partial cross-sectional explanatory view for explaining the flow-soldering of the printed circuit board with the electronic component shown in FIG. 1;

FIG. 3 is a partial enlarged view showing through-holes in the printed circuit board and lead pins of the electronic component shown in FIG. 1;

FIG. 4 is a schematic view for explaining the through-holes in the printed circuit board shown in FIG. 3 and conductor patterns connected thereto; and FIG. 5 is a schematic view similar to FIG. 4 for explaining through-holes and conductor patterns of a conventional printed circuit board.

DETAILED DESCRIPTION OF THE PREFERRED EMBODIMENT

A printed circuit board according to an embodiment of this invention will now be explained with reference to the attached drawings.

FIG. 1 is a fragmentary cross-sectional explanatory view showing a printed circuit board according to a preferred embodiment of this invention together with an electronic component.

The printed circuit board is designated by the reference symbol 10 in FIG. 1. The printed circuit board 10 has a multilayer structure composed of multiple stacked layers made of an insulating material such as glass/epoxy resin and is formed with conductor patterns. The layers are explained in detail below.

Electronic components 12 (typically transistor modules or other such discrete components; only one shown) are mounted on the mounting surface 10A of the printed circuit board 10. The following explanation is made taking a transistor module as an example of the electronic component 12. Although other electronic components are also mounted on the printed circuit board 10, they are omitted in the drawings.

The electronic component 12 is provided with multiple lead pins 14 for connecting it with the printed circuit board 10. Specifically, as shown in FIG. 1, the printed circuit board 10 has 10 pins designated from left to right as the first lead pin 14a, second lead pin 14b, third lead pin 14c, . . . , and tenth lead pin 14j. In the illustrated configuration, the first and tenth leads pins 14a, 14j are emitter terminals, the second, fourth, sixth and eighth lead pins 14b, 14d, 14f, 14h are base terminals, and the third, fifth, seventh and ninth lead pins 14c, 14e, 14g, 14i are collector terminals.

The printed circuit board 10 is formed with multiple (ten) through-holes 16 for insertion of the first to tenth lead pins 14a-14j. In FIG. 1, the first through-hole for insertion of the first lead pin 14a is designated 16a. Similarly, the second to tenth through-holes mated with the second to tenth lead pins 14b-14j are designated 16b-16j. The first to tenth through-holes 16a-16j are explained later.

The printed circuit board 10 and electronic component 12 structured in this manner are joined by flow-soldering. This will be explained briefly with reference to FIG. 2. A jet solder bath 24 that utilizes a pump 22 to jet and circulate molten lead-free solder 20 as indicated by arrows is installed under the printed circuit board 10 and electronic component 12. The jet solder bath 24 is equipped at an appropriate location with a heater 26 for maintaining the lead-free solder 20 at a prescribed temperature.

The electronic component 12 is provisionally mounted on the mounting surface 10A of the printed circuit board 10 by inserting the first to tenth lead pins 14a-14j into the first to tenth through-holes 16a-16j. Next, the printed circuit board 10 is moved in the direction of the arrow A in FIG. 2 to bring a soldering surface 10B of the printed circuit board 10 into contact with a surface 20A of the jetted lead-free solder 20. As a result, the lead-free solder 20 is charged into the through-holes 16, more exactly gaps 30 between the through-holes 16 and their associated lead pins 14, so as to rise to a prescribed level. The gap formed in the first through-hole 16a is designated 30a. Similarly, the gaps formed in second to tenth through-holes 16b-16j are designated 30b-30j.

The molten lead-free solder 20 is charged (rises) into the gaps 30a-30j to near the mounting surface 10A and is applied in an amount sufficient for forming fillets on the land regions (explained later) formed at the mounting surface 10A. The printed circuit board 10 is then moved farther in the direction of the arrow A so as to depart from the jet solder bath 24 and cool. Once the temperature of the lead-free solder 20 charged into the gaps 30a-30j has fallen below its solidification point, the lead-free solder 20 hardens (solidifies). The electronic component 12 is thus mounted on the printed circuit board 10 by the flow-soldering carried out in this manner. The fillets are formed on the land regions at both the mounting surface 10A and the soldering surface 10B.

The features of the printed circuit board 10 will now be explained with reference to FIG. 3.

FIG. 3 is a fragmentary enlarged view showing the first to third lead pins 14a, 14b, 14c of the electronic component 12 inserted into the first to third through-holes 16a, 16b, 16c of the printed circuit board 10 according to this embodiment. FIG. 4 is a schematic view for explaining the first to third through-holes 16a, 16b, 16c shown in FIG. 3 and conductor patterns connected thereto.

The printed circuit board 10 having the multilayer structure composed of multiple stacked layers formed with conductor patterns (conductor layers) as explained earlier will now be explained in detail. At the upper part of the printed circuit board 10 as viewed in FIGS. 3 and 4, there is a first conductor layer L1 formed with a conductor pattern (power ground) 34 for making contact with the first lead pin 14a (an emitter terminal) and putting at ground potential. Under the first conductor layer L1 is provided a second conductor layer L2 formed with a conductor pattern 36 for making connection with a lead pin of another electronic component (not shown).

Under the second conductor layer L2 is provided a third conductor layer L3 formed with a conductor pattern 38 similar to the conductor pattern 34 for making connection with the first lead pin 14a, and a conductor pattern 40 for making connection with the third lead pin 14c (a collector terminal) and transmitting signals. Under the third conductor layer L3 is provided a fourth conductor layer L4 formed with a conductor pattern 42 similar to the conductor patterns 34 and 38 for making connection with the first lead pin 14a, and a conductor pattern 44 for making connection with the second lead pin 14b (a base terminal) and transmitting signals. Insulating layers 5 are provided between the first conductor layer L1 and second conductor layer L2, the second conductor layer L2 and third conductor layer L3, and the third conductor layer L3 and fourth conductor layer L4 for insulating the layers from one another. The conductor patterns 34, 36, 38, 40, 42, 44 are made of copper foil.

As shown best in FIG. 4, of the conductor patterns formed on the first, third and fourth conductor layers L1, L3, L4, the conductor patterns 34, 38, 42 connected to the first lead pin 14a are formed as broad patterns having relatively large areas.

On the other hand, of the conductor patterns formed on the third and fourth conductor layers L3, L4, the conductor patterns 44, 40 connected to the second and third lead pins 14b, 14c are formed to have smaller areas than the conductor patterns 34, 38, 42. Therefore, the multiple conductor patterns formed on the layers can be differentiated as a) conductor patterns of relatively large area, i.e. broad patterns (first conductor patterns), and b) conductor patterns of smaller area than the broad patterns, i.e., conductor patterns other than the broad patterns (second conductor patterns).

The first and fourth conductor layers L1, L4 are located at the mounting surface 10A and soldering surface 10B, i.e., at the outer sides (front and rear sides) of the printed circuit board 10, and are thus constituted as "outer layers" (front layer and rear layer) whose conductor patterns 34, 42, 44 are exposed to the exterior. The surfaces of the conductor patterns 34, 42, 44 of the first and fourth conductor layers L1, L4 are subjected to a protective coating or other anti-oxidation treatment.

The second and third conductor layers L2, L3 are constituted as "inner layers" located inside the printed circuit board 10.

The first to third through-holes 16a, 16b, 16c will now be explained.

First, however, to provide background information that will make the explanation easier to understand, the through-holes of a conventional printed circuit board will be explained with reference to FIG. 5.

FIG. 5 is a schematic view similar to that of FIG. 4 for explaining the through-holes and conductor patterns of a conventional printed circuit board. Elements of the conventional printed circuit board corresponding to those of the first embodiment are assigned the same reference symbols as those of the first embodiment.

The first through-hole 16a1 of the conventional printed circuit board 101 is connected to the conductor patterns 34, 38, 42 of relatively large area and there are formed between the first through-hole 16a1 and the conductor patterns 34, 38, 42 thermal lands 481, 501, 521 for inhibiting escape of the heat of the molten lead-free solder 20 to the conductor patterns 34, 38, 42 at the time of performing soldering.

All three thermal lands 481, 501, 521 are formed in the same shape. Specifically, each comprises a land region 56 formed to enclose the first through-hole 16a1, linear regions 58 for connecting the land region. 56 with the conductor pattern 34, 38 or 42, teardrop regions 60 formed between the linear regions 58 and the land region 56, and clearance regions 62 formed between the land region 56 and the conductor pattern 34, 38 or 42. The land regions 56, linear regions 58 and teardrop regions 60 are formed of copper foil.

The land regions 56 are formed at the conductor layers L1, L2, L3, L4 in an annular shape enclosing the first through-hole 16a1 and each connects with its counterpart in the neighboring layer or layers. The linear regions 58 extend radially from the land regions 56 in the shape of straight lines. Each thermal land has a plurality, namely four, of linear regions 58.

Each teardrop region 60 is formed to grow in width from the associated linear region 58 toward the land region 56. As a result, the connection (contact) area between land region 56 and each linear region 58 can be expanded, thereby preventing occurrence of breakage (cracking) at the connection regions between the land region 56 and the linear regions 58 and ensuring reliable connection between the land region 56 and the respective linear regions 58. The widths of the linear regions 58 and teardrop regions 60 are appropriately defined in line with the current-carrying capacity required between the first through-hole 16a1 and conductor patterns 34, 38, 42.

The size of each clearance region 62, which is determined by the combined length of the associated linear region 58 and teardrop region 60, i.e., the size of the gap between the conductor pattern 34, 38 or 42 and the associated land region 56 (designated d1 in FIG. 5), is generally about 0.2 mm.

Like the first through-hole 16a1, the second and third through-holes 16b, 16c are also provided with land regions 66, 68 formed to enclose the second and third through-holes 16b, 16c.

The land region 66 formed at the second through-hole 16b is directly connected to the conductor pattern 44 formed at the fourth conductor layer L4. In other words, it is connected to the conductor pattern 44 without passing through a thermal land or the like. Similarly, the land region 68 formed at the third through-hole 16c is directly connected to the conductor pattern 40 formed at the third conductor layer L3 without passing through a thermal land or the like.

The areas of the conductor patterns 44, 40 connected to the second and third through-holes 16b, 16c are smaller than those of the conductor patterns 34, 38, 42 connected to the first through-hole 16a1. The heat capacities of the conductor patterns 44, 40 are therefore also small, so that these conductor patterns do not have to be connected through structures such as thermal lands for intentionally preventing the escape of heat.

As mentioned earlier, the diameter of the through-holes is made slightly larger than that of the lead pins to be inserted therein and is typically defined so as to leave a gap of about 0.3 mm between the through-holes and the lead pins.

Therefore, in the conventional printed circuit board 101, when the diameters of the first to third lead pins 14a, 14b, 14c are nearly the same, the diameters of the first to third through-holes 16a1, 16b, 16c are also nearly the same. This is because the diameters of the first to third through-holes 16a1, 16b, 16c are uniformly defined to be equal to the diameters of the first to third lead pins 14a, 14b, 14c plus about 0.3 mm.

When the electronic component 12 is fastened to the conventional printed circuit board 101 having the foregoing structure by flow-soldering, the solder rise property is liable to differ between the first through-hole 16a1 and the second and third through-holes 16b, 16c. Specifically, the solder rise property of the second and third through-holes 16b, 16c can be expected to be good but that of the first through-hole 16a1 is liable to be poor because the molten solder 20 tends to solidify before rising to the prescribed level notwithstanding the formation of the thermal lands 481, 501, 521 for reducing the amount of solder heat escaping to the conductor patterns 34, 38, 42.

This phenomenon is probably caused by the conductor patterns 34, 38, 42 connected to the first through-hole 16a1. This conclusion can be drawn from the fact that the heat capacity of a conductor pattern increases in proportion to its area, so that at the first through-hole 16a1 connected to the conductor patterns 34, 38, 42, which are of relatively large area, a considerable amount of solder heat escapes to the conductor patterns 34, 38, 42, thus causing the solder to solidify before rising to the prescribed level. From this it follows that mere formation of the thermal lands 481, 501, 521 between the first through-hole 16a1 and the conductor patterns 34, 38, 42 does not necessarily ensure the desired solder rise property.

Moreover, the teardrop regions 60 constituting part of the thermal lands are shaped so as to enlarge the connection (contact) area between the land regions 56 and the associated linear regions 58. This can be considered another factor causing the amount of heat escaping to the conductor patterns 34, 38, 42 to become greater than when the land regions 56 and the linear regions 58 are directly connected.

Practically, however, the teardrop regions 60 have been hard to eliminate because by expanding the connection area between the land regions 56 and the linear regions 58 they help to prevent occurrence of breakage (cracking) at the connection regions between the land regions 56 and the linear regions 58, and, by this, operate to ensure reliable connection between the land regions 56 and the linear regions 58.

In light of this situation, the inventors carried out a study through which they learned that the breakage that tends to occur at the connection regions between land regions 56 and the linear regions 58 in the absence of the teardrop regions 60 arises mostly at the outer conductor layers located at the outer sides of the printed circuit board 101. This is thought to be related to the fact that when, for example, a soldered electronic component is found to be faulty, replacement requires use of a soldering iron to melt the solidified lead-free solder, and breakage is apt to be caused by the stress produced between the tip of the soldering iron and the land region at this time.

To go into further detail, when it is found after mounting an electronic component on the printed circuit board by flow-soldering that, for instance, the amount of charged solder is insufficient or the electronic component is faulty, it becomes necessary to increase the amount of solder or remove the electronic component. For this, a worker needs to melt the lead-free solder by bringing a soldering iron heated to around 300° C. into contact with the vicinity of the land region.

If the temperature of the glass/epoxy printed circuit board rises above the glass transition point (e.g., 120-140° C.) in the course of this work, the heated region changes from its hard vitreous state to a soft rubbery state. When the heated region assumes this rubbery state, the tip of the soldering iron coming in contact with the vicinity of the land region or linear regions produces stress at the contacted region and also the force of adhesion of the printed circuit board with the land region and the linear regions lowers, thereby causing shifting (displacement) therebetween. As a result, breakage, i.e. cracking, occurs at the connection regions between the land region and linear regions formed on the outer side of the printed circuit board.

On the other hand, even if the vicinities of the land regions and linear regions at the second and third conductor layers (inner layers) L2, L3 located inside the printed circuit board 101 should be heated to higher than the glass transition point and become rubbery, the aforesaid stress does not readily produce shifting (displacement) of the land regions and linear regions relative to the printed circuit board because these regions are sandwiched within the rubbery region. Breakage (cracking) therefore does not readily occur at the connection regions between the land regions and linear regions formed inside the printed circuit board.

In the printed circuit board 10 according to this invention, the disadvantages of the conventional printed circuit board 101 are overcome by varying the diameters of the through-holes 16a-16j formed in the printed circuit board 10, more exactly the gaps 30a-30j between the first to tenth through-holes 16a-16j and the first to tenth lead pins 14a-14j, in accordance with the type of conductor pattern to which the individual through-holes are connected.

In addition, of the thermal lands formed at the multiple conductor layers L1, L2, L3, L4, only those formed at the conductor layers L1, L4 located on the outer sides are formed with the teardrop regions 60.

These features will now be explained with reference to FIGS. 3 and 4.

The gap between the first lead pin 14a and the first through-hole 16a connected to the conductor patterns 34, 38, 42 of relatively large area, i.e., the difference (da–Da) obtained by subtracting the diameter Da of the first lead pin 14a from the diameter da of the first through-hole 16a, is defined to be larger than the gap between the second and third lead pins 14b, 14c and the second and third through-holes 16b, 16c connected to the conductor patterns 44, 40 of smaller area than the conductor patterns 34, 38, 42, i.e. larger than the differences (db–Db) and (dc–Dc) obtained by subtracting the diameters Db, Dc of the second and third lead pins 14b, 14c from the diameters db, dc of the second and third through-holes 16b, 16c.

Specifically, the diameters db, dc of the second and third through-holes 16b, 16c are defined by adding about 0.3 mm to the diameters Db, Dc of the second and third lead pins 14b, 14c, while the diameter da of the first through-hole 16a is defined by adding about 0.5 mm to the diameter of the first lead pin 14a.

Therefore, the amount of lead-free solder 20 charged into the gap 30a at the first through-hole 16a is greater that at the conventional first through-hole 16a1. This increase in the amount of molten lead-free solder 20 also increases the amount of heat imparted to the land regions 56, so that the effect of whatever amount of heat should escape to the conductor patterns 34, 38, 42 via the linear regions 58 and the like can be diminished, thereby enabling the molten lead-free solder 20 to rise to the prescribed level in the gap 30a and thus achieving improved solder rise property.

Similarly to in the prior art, the thermal lands 48, 50, 52 are formed between the first through-hole 16a and the conductor patterns 34, 38, 42.

The thermal lands 48, 52 formed on the first and fourth conductor layers L1, L4 (the outer layers) located on the outer sides of the printed circuit board 10 are structured to include land regions 56, linear regions 58, teardrop regions 60 and clearance regions 62.

In contrast, the thermal land 50 formed on the third conductor layer L3 (inner layer) located inside the printed circuit board 10 is structured to include a land region 56, linear regions 58 and clearance regions 62. In other words, the thermal land 50 is structured so as not to include (to eliminate) the teardrop regions 60 but to directly connect the land region 56 to the conductor pattern 38 through the linear regions 58.

Therefore, the connection (contact) area between the land region 56 and the linear regions 58 in the thermal land 50 formed at an inner layer is not enlarged by teardrop regions 60, so that the amount of heat of the lead-free solder 20 escaping from the land region 56 to the conductor pattern 38 can be reduced. As a result, the molten lead-free solder 20 can rise to the prescribed level in the gap 30a, thereby achieving still more improved solder rise property, and breakage (cracking) at the connection regions between the land regions 56 and linear regions 58 formed on the outer sides of the printed circuit board 10 can be effectively prevented.

Further, while the size d1 of the clearance regions 62 of the conventional thermal lands 481, 501, 521 is set at about 0.2 mm, the size of the clearance regions 62 of the thermal lands 48, 50, 52 according to this invention (designated d in FIGS. 3 and 4) is set at about 0.5 mm.

Thus the clearance regions 62 are made large, i.e., the length of the linear regions 58 (in the case of the thermal lands 48, 52, the combined lengths of the linear regions 58 and teardrop regions 60) are extended. The overall size of the thermal lands 48, 50, 52 can therefore be enlarged to reduce the amount of the heat of the lead-free solder 20 that escapes from the land regions 56 to the conductor patterns 34, 38, 42. As a result, the molten lead-free solder 20 can rise to the prescribed level in the gap 30a, thereby achieving still more improved solder rise property.

In this preferred embodiment, the tenth through-hole 16j of the printed circuit board 10 is given a structure like that of the first through-hole 16a because, like the first through-hole 16a, it is to have an emitter terminal inserted therein and is connected to a broad conductor pattern. The effect produced by the through-hole 16j is the same as that of the first through-hole 16a and will not be explained again here. The fourth to ninth through-holes 16d-16i are given structures like those of the second and third through-holes 16b, 16c because, like the second and third through-holes 16b, 16c, they are to have a base terminal or collector terminal inserted therein and are connected to conductor patterns of relatively small area. The effects produced by the through-holes 16d-16i are the same as those of the second and third through-holes 16b, 16c and will not be explained again here.

As explained in the foregoing, the printed circuit board 10 of this preferred embodiment is formed with the first and tenth through-holes 16a, 16j to which are connected the first conductor patterns, namely the conductor patterns (broad patterns) 34, 38, 42 etc. formed at the first, third and fourth conductor layers L1, L3, L4 and into which are inserted the first and tenth lead pins 14a, 14j, and is provided with the second to ninth through-holes 16b-16i to which are connected the second conductor patterns of smaller area than the first conductor patterns, namely the conductor patterns 44, 40 etc. formed at the fourth and third conductor layers L4, L3 and into which are inserted the second to ninth lead pins 14b-14i, the printed circuit board 10 being configured to make the gaps 30a, 30j between the first and tenth through-holes 16a, 16j and the first and tenth lead pins 14a, 14j larger than the gaps 30b-30i between the second to ninth through-holes 16b-16i and the second to ninth lead pins 14b-14i. As a result, a larger amount of solder can be charged into the gaps 30a, 30j when the electronic component 12 is mounted on (soldered to) the printed circuit board 10. This means that the amount of heat transferred from the molten lead-free solder 20 to the first and tenth through-holes 16a, 16j, more exactly to the land regions 56 formed to surround the first and tenth through-holes 16a, 16j, can be increased, thereby enabling the molten lead-free solder 20 to rise to the prescribed level in the gaps 30a, 30j and thus achieving improved solder rise property without increasing the number of production processes or degrading the strength with respect to the electronic component 12.

Further, the printed circuit board 10 is formed by laminating the multiple conductor layers L1, L2, L3, L4 and is provided with the multiple thermal lands 48, 50, 52 that connect the first conductor patterns (broad patterns) 34, 38, 42 etc. formed at the multiple layers L1, L3, L4 to the first and tenth through-holes 16a, 16j, and of the thermal lands formed at the multiple conductor layers, only those formed at the conductor layers L1, L4 located on the outer sides are formed with the teardrop regions 60, which is tantamount to saying that the teardrop regions 60 are eliminated (not provided) at the conductor layer L3 located inside. Owing to this configuration, the amount of solder heat escaping to the first conductor patterns 34, 38, 42 at the time of soldering the electronic component 12 to the printed circuit board 10 can be reduced, whereby the molten lead-free solder can rise to the prescribed level in the gaps 30a, 30j between the first and tenth through-holes 16a, 16j and the first and tenth lead pins 14a, 14j, thus achieving a further improvement in solder rise property.

In addition, the printed circuit board 10 is configured so that of the multiple thermal lands 48, 50, 52 formed at the multiple conductor layers only those formed at the conductor layers L1, L4 located on the outer sides are formed with the teardrop regions 60. As a result, breakage (cracking) of conductor patterns that tends to occur at the conductor patterns formed on the outer sides, more exactly breakage at the connection regions between the land region 56 and linear regions 58 constituting the thermal lands 48, 52 can be effectively prevented.

Although the foregoing explanation was made taking conductor patterns for establishing ground potential as examples of the broad conductor patterns 34, 38, 42, they may instead be conductor patterns for supplying power or broad conductor patterns of relatively large current-carrying capacity for conducting relatively large currents (e.g., about 1A). This is because a conductor pattern or the like of relatively large current-carrying capacity is of large area and therefore has a large heat capacity like the conductor patterns 34, 38, 42, so that it is also liable to experience the problems explained earlier.

Although the printed circuit board 10 was described in the foregoing as comprising the four conductor layers L1, L2, L3, L4, this is not a limitation and the printed circuit board can instead be composed of three conductor layers or five or more conductor layers.

Although the thermal lands 48, 50, 52 described in the foregoing each comprises four linear regions 58, this is not a limitation and the number of linear regions can be appropriately varied in accordance with the required current-carrying capacity of the through-holes and conductor patterns.

Although the foregoing explanation was made taking a transistor module as an example of the electronic component 12, the electronic component can instead be a capacitor or any of various other kinds of electronic components.

Although it was explained in the foregoing that the electronic component 12 and printed circuit board 10 are soldered using the lead-free solder 20, they can instead be soldered using a conventional lead-containing eutectic solder.

Japanese Patent Application No. 2004-357758 filed on Dec. 10, 2004, is incorporated herein in its entirety.

While the invention has thus been shown and described with reference to specific embodiments, it should be noted that the invention is in no way limited to the details of the described arrangements; changes and modifications may be made without departing from the scope of the appended claims.

What is claimed is:

1. A printed circuit board having at least a first conductor pattern, a second conductor pattern whose area is smaller than that of the first conductor pattern, and electronic components having at least a first lead pin and a second lead pin, comprising:
   a first through-hole formed to be connected to the first conductor pattern for insertion of the first lead pin; and
   a second through-hole formed to be connected to the second conductor pattern for insertion of the second lead pin,
   wherein a distance between an inner surface if the thoughhole and an outer surface of the first lead pin is made lager than a distance between an inner surface of the second though-hole and an outer surface of the second lead pin.

2. The printed circuit board according to claim 1, further including:
   a plurality of stacked conductor layers, and
   a plurality of thermal lands connecting the first conductor pattern formed on each of the plurality of the stacked conductor layers to the first through-hole,
   wherein each of the thermal lands formed on the conductor layers located on outer sides of the board is provided with a teardrop region.

3. The printed circuit board according to claim 2, wherein the thermal land includes:
   a land region formed to enclose the first through-hole; and
   a linear region connecting the land region with the first conductor pattern,
   wherein a length of the linear region is about 0.5 mm.

4. The printed circuit board according to claim 1, wherein the gap between the first through-hole and the first lead pin is made larger than that between the second through-hole and the second lead pin by 0.2 mm.

5. The printed circuit board according to claim 1, wherein the electronic component is a transistor module.

6. The printed circuit board according to claim 5, wherein the first lead pin is an emitter terminal and the second lead pin is a base terminal or a collector terminal.

* * * * *